(12) United States Patent
Schmid et al.

(10) Patent No.: US 11,043,400 B2
(45) Date of Patent: Jun. 22, 2021

(54) MOVABLE AND REMOVABLE PROCESS KIT

(71) Applicant: Applied Materials, Inc., Santa Clara, CA (US)

(72) Inventors: Andreas Schmid, Meyriez (CH); Denis M. Koosau, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 42 days.

(21) Appl. No.: 16/222,831

(22) Filed: Dec. 17, 2018

(65) Prior Publication Data

US 2020/0234981 A1 Jul. 23, 2020

Related U.S. Application Data

(60) Provisional application No. 62/609,044, filed on Dec. 21, 2017.

(51) Int. Cl.
| | | |
|---|---|---|
| *H01L 21/67* | (2006.01) | |
| *H01L 21/3065* | (2006.01) | |
| *H01L 21/687* | (2006.01) | |
| *C23C 16/52* | (2006.01) | |
| *H01J 37/32* | (2006.01) | |

(52) U.S. Cl.
CPC .... *H01L 21/67063* (2013.01); *H01L 21/3065* (2013.01); *H01L 21/68735* (2013.01); *C23C 16/52* (2013.01); *H01J 37/32642* (2013.01)

(58) Field of Classification Search
None
See application file for complete search history.

(56) References Cited

U.S. PATENT DOCUMENTS

| | | | |
|---|---|---|---|
| 5,267,607 A | 12/1993 | Wada | |
| 5,660,673 A | 8/1997 | Miyoshi | |
| 5,730,801 A | 3/1998 | Tepman et al. | |
| 5,762,714 A | 6/1998 | Mohn et al. | |
| 5,851,140 A | 12/1998 | Barns et al. | |
| 5,885,428 A * | 3/1999 | Kogan | H01L 21/6833 204/298.15 |
| 6,022,809 A | 2/2000 | Fan | |
| 6,044,534 A | 4/2000 | Seo et al. | |
| 6,206,976 B1 | 3/2001 | Crevasse et al. | |

(Continued)

FOREIGN PATENT DOCUMENTS

| | | |
|---|---|---|
| CN | 105336561 A | 2/2016 |
| CN | 105789010 A | 7/2016 |

(Continued)

OTHER PUBLICATIONS

Taiwan Office Action dated Mar. 22, 2019 for Application No. 107217385.

(Continued)

*Primary Examiner* — Karla A Moore
*Assistant Examiner* — Tiffany Z Nuckols
(74) *Attorney, Agent, or Firm* — Patterson + Sheridan, LLP

(57) ABSTRACT

Aspects of the present disclosure generally relate to methods and apparatuses for adjusting an edge ring position, and for removing or replacing one or more components of a process kit of a process chamber. The process kit includes one or more of an edge ring, a support ring, a sliding ring, and other consumable or degradable components.

17 Claims, 12 Drawing Sheets

(56) References Cited

U.S. PATENT DOCUMENTS

| | | | |
|---|---|---|---|
| 6,375,748 B1 | 4/2002 | Yudovsky et al. | |
| 6,391,787 B1 | 5/2002 | Dhindsa et al. | |
| 6,511,543 B1* | 1/2003 | Stauss | H01L 21/68721 |
| | | | 118/500 |
| 6,589,352 B1 | 7/2003 | Yudovsky et al. | |
| 6,676,759 B1 | 1/2004 | Takagi | |
| 6,709,547 B1 | 3/2004 | Ni et al. | |
| 6,744,212 B2 | 6/2004 | Fischer et al. | |
| 6,773,562 B1 | 8/2004 | Inagawa et al. | |
| 6,896,765 B2 | 5/2005 | Steger | |
| 6,898,558 B2 | 5/2005 | Klekotka | |
| 7,138,014 B2 | 11/2006 | Stevens et al. | |
| 7,138,067 B2 | 11/2006 | Vahedi et al. | |
| 7,176,403 B2 | 2/2007 | Steger | |
| 7,252,738 B2 | 8/2007 | Tong et al. | |
| 7,311,784 B2 | 12/2007 | Fink | |
| 7,338,578 B2 | 3/2008 | Huang et al. | |
| 7,589,950 B2 | 9/2009 | Parkhe et al. | |
| 7,824,146 B2 | 11/2010 | Lanee et al. | |
| 7,968,469 B2 | 6/2011 | Collins et al. | |
| 8,270,141 B2 | 9/2012 | Willwerth et al. | |
| 8,298,371 B2 | 10/2012 | Koshimizu et al. | |
| 8,441,640 B2 | 5/2013 | Patalay et al. | |
| 8,696,878 B2 | 4/2014 | Riker et al. | |
| 8,900,398 B2 | 12/2014 | Dhindsa et al. | |
| 8,933,628 B2 | 1/2015 | Banna et al. | |
| 8,988,848 B2 | 3/2015 | Todorow et al. | |
| 8,999,106 B2 | 4/2015 | Liu et al. | |
| 9,011,637 B2 | 4/2015 | Yamamoto | |
| 9,017,526 B2 | 4/2015 | Singh et al. | |
| 9,076,636 B2 | 7/2015 | Ohata et al. | |
| 9,142,391 B2 | 9/2015 | Yamamoto | |
| 9,287,093 B2 | 3/2016 | Singh et al. | |
| 9,410,249 B2 | 8/2016 | Male et al. | |
| 9,583,357 B1 | 2/2017 | Long et al. | |
| 9,601,319 B1 | 3/2017 | Bravo et al. | |
| 9,620,376 B2 | 4/2017 | Kamp et al. | |
| 9,761,459 B2 | 9/2017 | Long et al. | |
| 9,852,889 B1 | 12/2017 | Kellogg et al. | |
| 9,881,820 B2 | 1/2018 | Wong et al. | |
| 9,947,517 B1 | 4/2018 | Luere et al. | |
| 10,103,010 B2 | 10/2018 | Luere et al. | |
| 2003/0173031 A1 | 9/2003 | Aggarwal et al. | |
| 2003/0201069 A1 | 10/2003 | Johnson | |
| 2004/0053428 A1 | 3/2004 | Steger | |
| 2004/0149389 A1 | 8/2004 | Fink | |
| 2004/0261946 A1 | 12/2004 | Endoh et al. | |
| 2005/0061447 A1 | 3/2005 | Kim et al. | |
| 2005/0133164 A1 | 6/2005 | Fischer et al. | |
| 2005/0263070 A1 | 12/2005 | Fink | |
| 2008/0173237 A1 | 7/2008 | Collins et al. | |
| 2008/0236749 A1 | 10/2008 | Koshimizu et al. | |
| 2008/0289766 A1 | 11/2008 | Heemstra et al. | |
| 2009/0041568 A1 | 2/2009 | Muraoka et al. | |
| 2009/0067954 A1 | 3/2009 | Lanee et al. | |
| 2010/0101729 A1 | 4/2010 | Kim et al. | |
| 2010/0206484 A1 | 8/2010 | Hiromi et al. | |
| 2011/0157760 A1 | 6/2011 | Willwerth et al. | |
| 2011/0287631 A1 | 11/2011 | Yamamoto | |
| 2012/0052599 A1 | 3/2012 | Brouk et al. | |
| 2012/0091108 A1 | 4/2012 | Lin et al. | |
| 2012/0176692 A1* | 7/2012 | Yamawaku | H01J 37/32724 |
| | | | 359/825 |
| 2012/0256363 A1 | 10/2012 | Okita et al. | |
| 2012/0305184 A1 | 12/2012 | Singh et al. | |
| 2013/0106286 A1 | 5/2013 | Banna et al. | |
| 2013/0155568 A1 | 6/2013 | Todorow et al. | |
| 2014/0017900 A1 | 1/2014 | Doba et al. | |
| 2014/0213055 A1 | 7/2014 | Himori et al. | |
| 2014/0265089 A1 | 9/2014 | Tantiwong et al. | |
| 2015/0064809 A1 | 3/2015 | Lubomirsky | |
| 2015/0181684 A1 | 6/2015 | Banna et al. | |
| 2015/0200124 A1 | 7/2015 | Yamamoto | |
| 2015/0332951 A1 | 11/2015 | Male et al. | |
| 2016/0042926 A1 | 2/2016 | Ishikawa et al. | |
| 2016/0056017 A1 | 2/2016 | Kim et al. | |
| 2016/0211165 A1 | 7/2016 | McChesney et al. | |
| 2016/0211166 A1* | 7/2016 | Yan | H01L 21/67069 |
| 2016/0240415 A1 | 8/2016 | Sekiya | |
| 2017/0018411 A1 | 1/2017 | Sriraman et al. | |
| 2017/0069462 A1 | 3/2017 | Kanarik et al. | |
| 2017/0103870 A1 | 4/2017 | Marakhtanov et al. | |
| 2017/0110335 A1 | 4/2017 | Yang et al. | |
| 2017/0113355 A1 | 4/2017 | Genetti et al. | |
| 2017/0115657 A1 | 4/2017 | Trussell et al. | |
| 2017/0117170 A1 | 4/2017 | Wong et al. | |
| 2017/0117172 A1 | 4/2017 | Genetti et al. | |
| 2017/0133283 A1 | 5/2017 | Kenworthy | |
| 2017/0178917 A1 | 6/2017 | Kamp et al. | |
| 2017/0213758 A1 | 7/2017 | Rice et al. | |
| 2017/0236688 A1 | 8/2017 | Caron et al. | |
| 2017/0236741 A1 | 8/2017 | Angelov et al. | |
| 2017/0236743 A1 | 8/2017 | Severson et al. | |
| 2017/0250056 A1 | 8/2017 | Boswell et al. | |
| 2017/0263478 A1 | 9/2017 | McChesney et al. | |
| 2017/0278679 A1 | 9/2017 | Angelov et al. | |
| 2017/0287682 A1 | 10/2017 | Musselman et al. | |
| 2017/0287753 A1 | 10/2017 | Musselman et al. | |
| 2017/0316935 A1 | 11/2017 | Tan et al. | |
| 2017/0330786 A1 | 11/2017 | Genetti et al. | |
| 2017/0334074 A1 | 11/2017 | Genetti et al. | |
| 2017/0372912 A1 | 12/2017 | Long et al. | |
| 2018/0019107 A1 | 1/2018 | Ishizawa | |
| 2018/0061696 A1 | 3/2018 | D'Ambra et al. | |
| 2018/0090354 A1 | 3/2018 | Sugita et al. | |
| 2018/0166259 A1 | 6/2018 | Ueda | |
| 2018/0218933 A1 | 8/2018 | Luere et al. | |
| 2018/0233328 A1 | 8/2018 | Ueda et al. | |
| 2018/0277416 A1 | 9/2018 | Takahashi et al. | |
| 2018/0301322 A1 | 10/2018 | Sugita et al. | |
| 2018/0308737 A1 | 10/2018 | Moriya et al. | |
| 2018/0315583 A1 | 11/2018 | Luere et al. | |
| 2018/0315640 A1 | 11/2018 | Ueda et al. | |
| 2019/0088531 A1 | 3/2019 | Sarode Vishwanath et al. | |
| 2019/0172714 A1 | 6/2019 | Bobek et al. | |

FOREIGN PATENT DOCUMENTS

| | | |
|---|---|---|
| TW | 439093 B | 6/2001 |
| TW | 201324674 A | 6/2013 |
| WO | 2008005756 A2 | 1/2008 |
| WO | 2013035983 A1 | 3/2013 |

OTHER PUBLICATIONS

Chinese Office Action dated May 16, 2019 for Application No. 201822159176.8.

"Bracelet Holder Vise Clamp Stone Prong Pave Channel Setting Setter." ProLineMax, www.prolinemax.com/Bracelet-Holder-Vise-Clamp-Stone-Prong-Pave-Channel-Setting-Setter-_p_1006.html.

International Search Report and Written Opinion dated Apr. 24, 2017 for Application No. PCT/US2016/069449.

Chinese Office Action for Application No. 201821554985.2 dated Feb. 19, 2019 (APPM/25317US).

Taiwan Office Action dated Sep. 20, 2019 for Application No. 106100104.

PCT Notification of Transmittal of the International Search Report and the Written Opinion of the International Searching Authority for International Application No. PCT/US2019/051771; dated Mar. 24, 2020; 11 total pages.

* cited by examiner

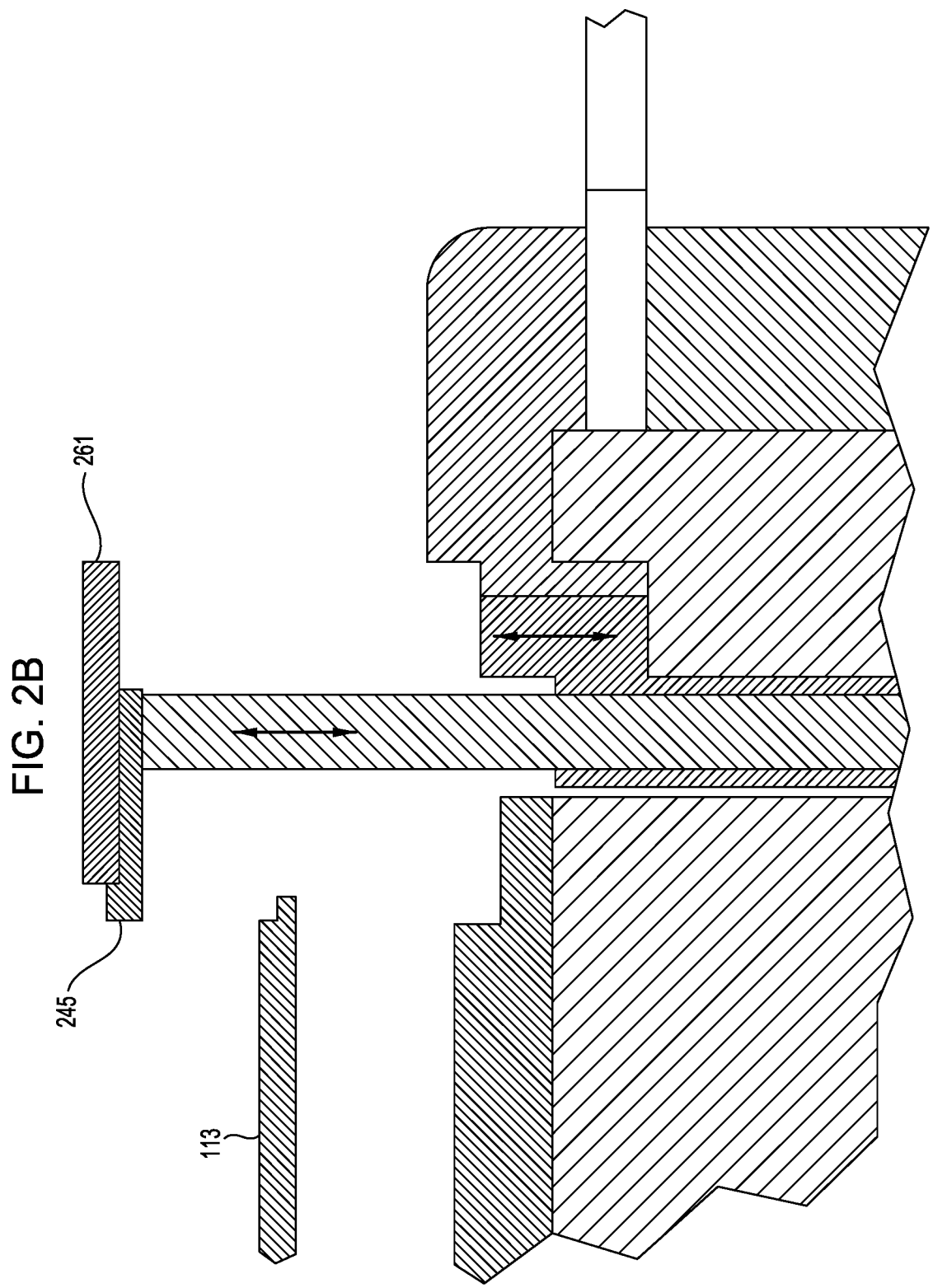

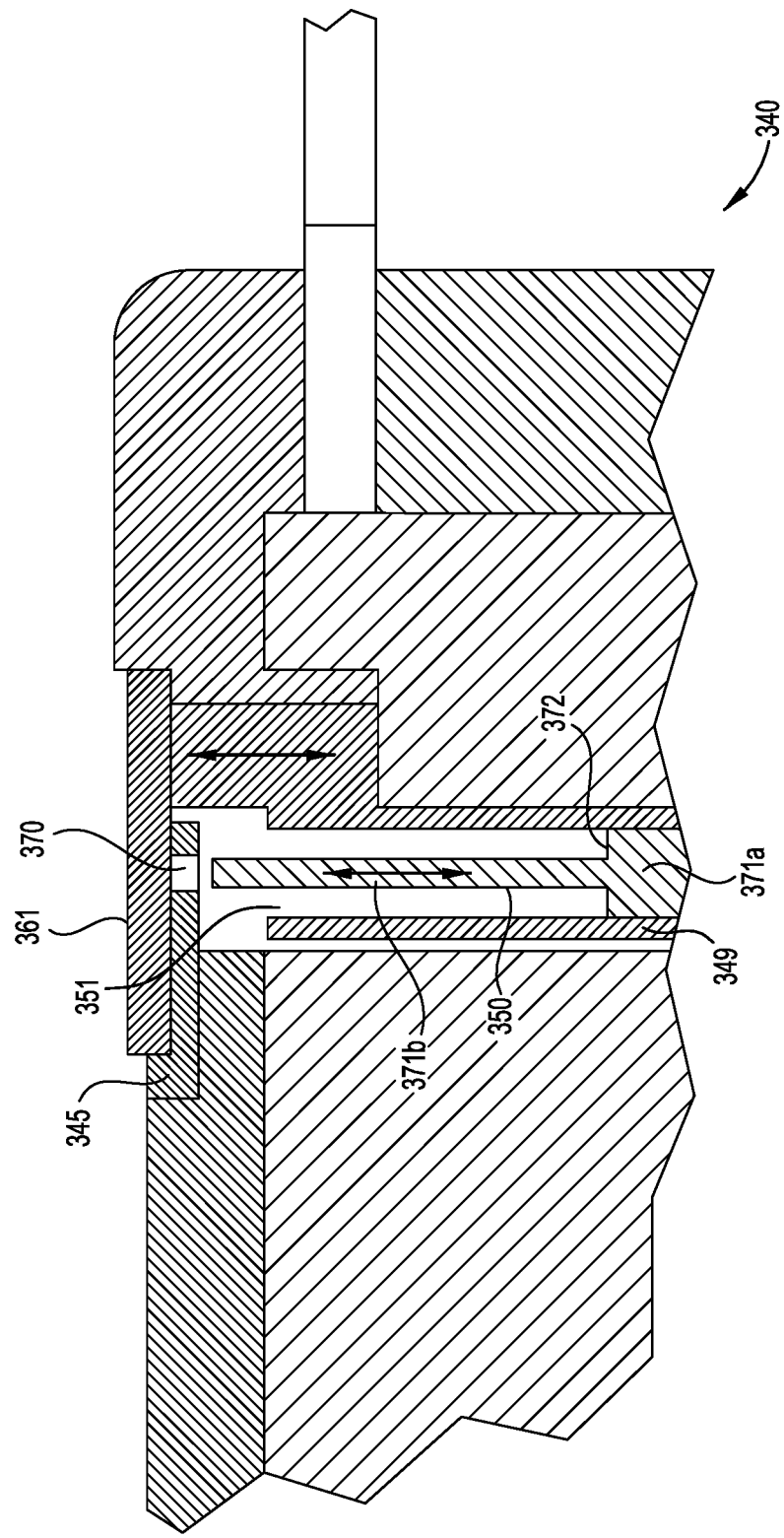

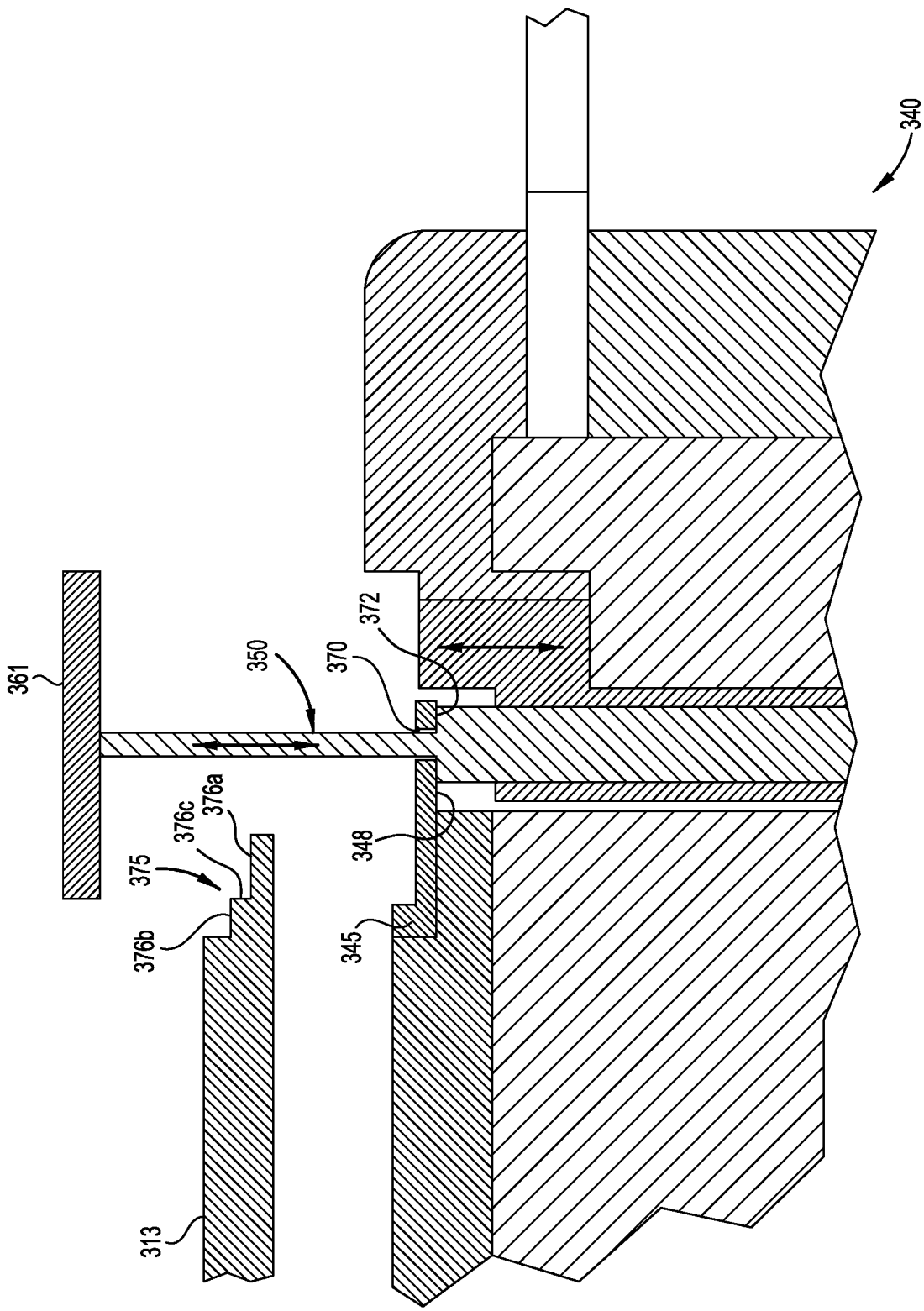

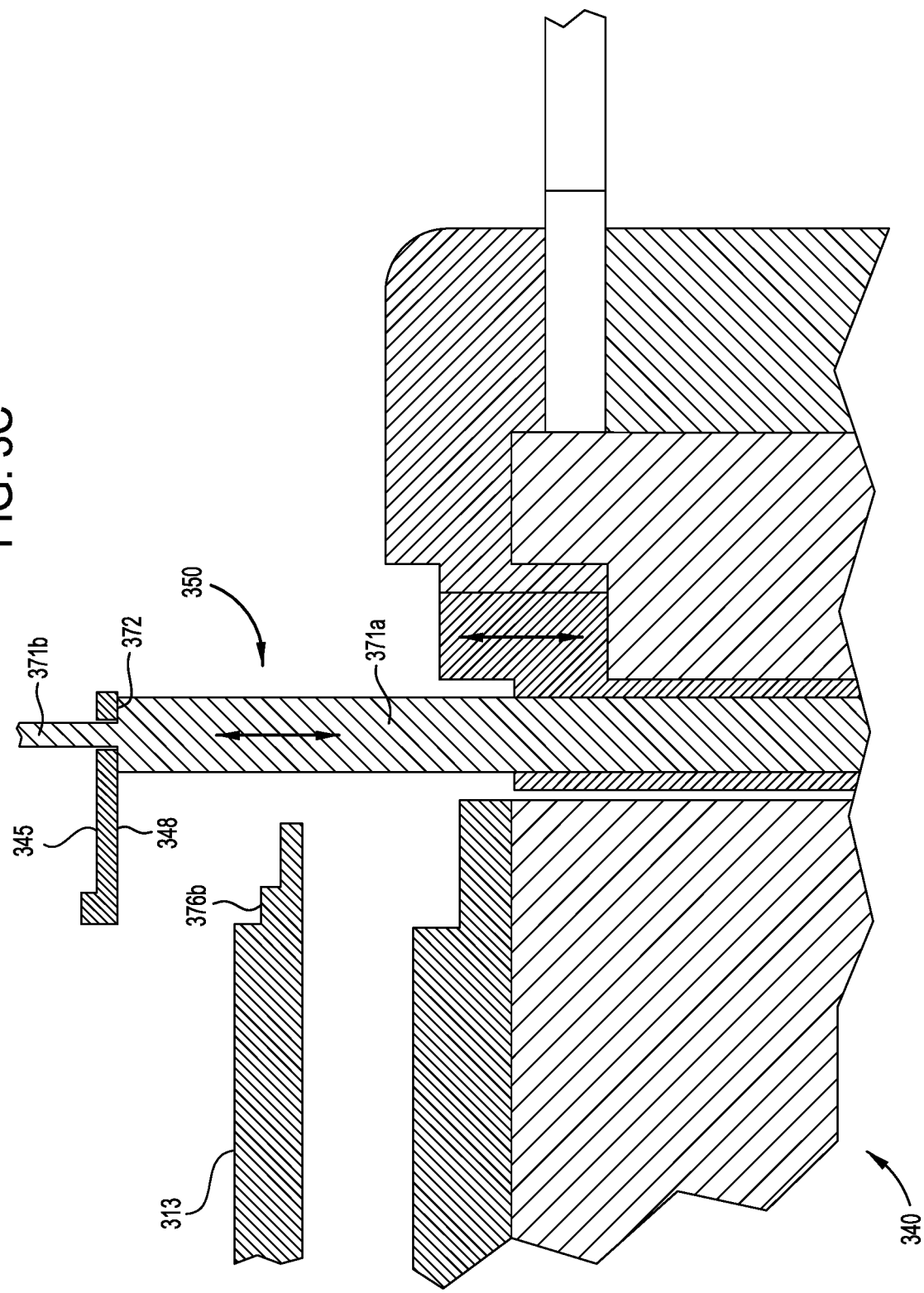

MOVABLE AND REMOVABLE PROCESS KIT

CROSS-REFERENCE TO RELATED APPLICATIONS

This application claims benefit of U.S. Provisional Patent Application Ser. No. 62/609,044, filed on Dec. 21, 2017, which is herein incorporated by reference.

BACKGROUND

Field

Aspects of the present disclosure generally relate to apparatuses and methods for edge ring and/or support ring replacement in processing chambers, such as those used in semiconductor processing.

Description of the Related Art

In processing chambers, such as etch chambers, substrates are etched while electrostatically clamped in position. Typically, one or more circular parts, referred to as edge rings, processing rings, support rings and the like, are positioned around the outer diameter of the substrate to protect the upper surface of the electrostatic chuck from being etched by etchant chemistry or to facilitate processing of a substrate. These rings are made from several different materials and can have different shapes, both of which affect process uniformity near the substrate perimeter. During processing, these rings are etched over time thereby resulting in shape changes as well as changes in processing uniformity.

To address the changes in processing uniformity due to deterioration, these rings are changed according to a schedule. Conventionally, to replace one of these rings, processing chambers are opened to allow an operator to have access to the ring inside. However, this process is time consuming, and due to venting of the processing chambers, may take up to 24 hours to get processing back online.

Therefore, there is a need for new methods and apparatuses for replacing consumable components within a processing chamber.

SUMMARY

Aspects of the present disclosure generally relate to apparatuses and methods for consumable part replacement, such as process kit rings and/or support rings and/or edge rings, within process chambers.

In one example, a process kit for a substrate support comprises a sliding ring having a body defined by an inner diameter and an outer diameter, the body having one or more openings formed therethrough, wherein each of the one or more openings may have an axis that is parallel to an axis of a central opening of the body. The process kit also includes a support ring having a stepped upper surface with a radially inward portion raised above a radially outward portion, the support ring having an outer diameter less than the inner diameter of the body of the sliding ring. The process kit further includes an edge ring having a planar upper surface and a planar lower surface, the edge ring having: an inner diameter less than the outer diameter of the support ring, and an outer diameter greater than the outer diameter of the support ring.

In another example, a process kit for a substrate support comprises a sliding ring having a body defined by an inner diameter and an outer diameter, the body having one or more openings formed therethrough, wherein each of the one or more openings may have an axis that is parallel to an axis of a central opening of the body. The process kit also includes a support ring having a stepped upper surface with a radially inward portion raised above a radially outward portion, the support ring having an outer diameter greater than the inner diameter of the body of the sliding ring, and one or more openings formed through the support ring, wherein each of the one or more openings formed through the support ring may be aligned with one of the one or more openings formed through the body of the sliding ring. The process kit further includes an edge ring having a planar upper surface and a planar lower surface; the edge ring having an inner diameter less than the outer diameter of the support ring, and an outer diameter greater than the outer diameter of the support ring.

In another example, a substrate support comprises an electrostatic chuck base, a puck positioned over the electrostatic chuck base, and a process kit for the substrate support. The process kit for the substrate support includes a sliding ring having a body defined by an inner diameter and an outer diameter, the body having one or more openings formed therethrough, wherein each of the one or more openings may have an axis that is parallel to an axis of a central opening of the body. The process kit also includes a support ring having a stepped upper surface with a radially inward portion raised above a radially outward portion, the support ring having an outer diameter less than the inner diameter of the body of the sliding ring. The process kit further includes an edge ring having a planar upper surface and a planar lower surface, the edge ring having: an inner diameter less than the outer diameter of the support ring, and an outer diameter greater than the outer diameter of the support ring.

In another example, a method comprises actuating a plurality of lift pins vertically upward, each lift pin including a first diameter at an upper portion thereof and a second diameter greater than the first diameter at a lower portion thereof, the actuating including directing the upper portions of the lift pins through corresponding openings in a support ring; vertically actuating an edge ring positioned over the support ring; transferring the edge ring to a carrier; and removing the edge ring from a process chamber.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

FIGS. 2A and 2B are schematic partial views of a substrate support during a ring removal operation, according to another aspect of the disclosure.

FIGS. 3A-3C are schematic partial views of a substrate support during a ring removal operation, according to another aspect of the disclosure.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Aspects of the present disclosure generally relate to removing or replacing one or more components of a process kit of a processing chamber using a carrier. The one or more components of the process kit include an edge ring, a support ring, a sliding ring, and other consumable or degradable components.

FIGS. 1A-1J are partial schematic sectional views of a processing chamber 107 during removal of an edge ring 161 therefrom, according to aspects of the disclosure. While conventional processing chambers require disassembly by an operator to replace eroded components such as edge ring 161, the processing chamber 107 is configured to facilitate replacement of the edge ring 161 without disassembly of the processing chamber 107. Disassembly of the processing chamber 107 is avoided by transferring the edge ring 161 through a port 108 of the processing chamber 107.

The processing chamber 107 may be any of an etch chamber, deposition chamber (including atomic layer deposition, chemical vapor deposition, physical vapor deposition, or plasma enhanced versions thereof), anneal chamber, and the like, which utilizes a substrate support 140 therein. Exemplary process chambers include those produced by Applied Materials, Inc., of Santa Clara, Calif.

Figure 1A:
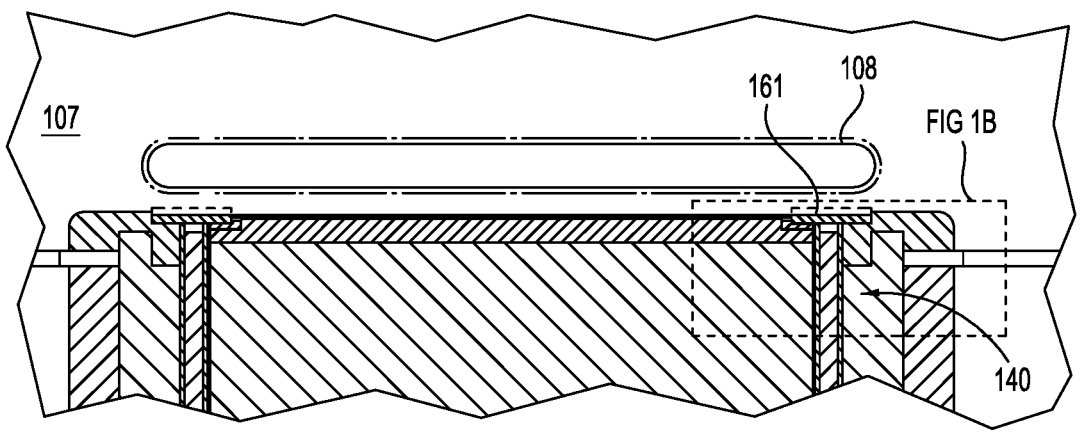
FIGS. 1A-1J are partial schematic sectional views of a processing chamber during removal of a ring therefrom, according to aspects of the disclosure.
Figure 1B:
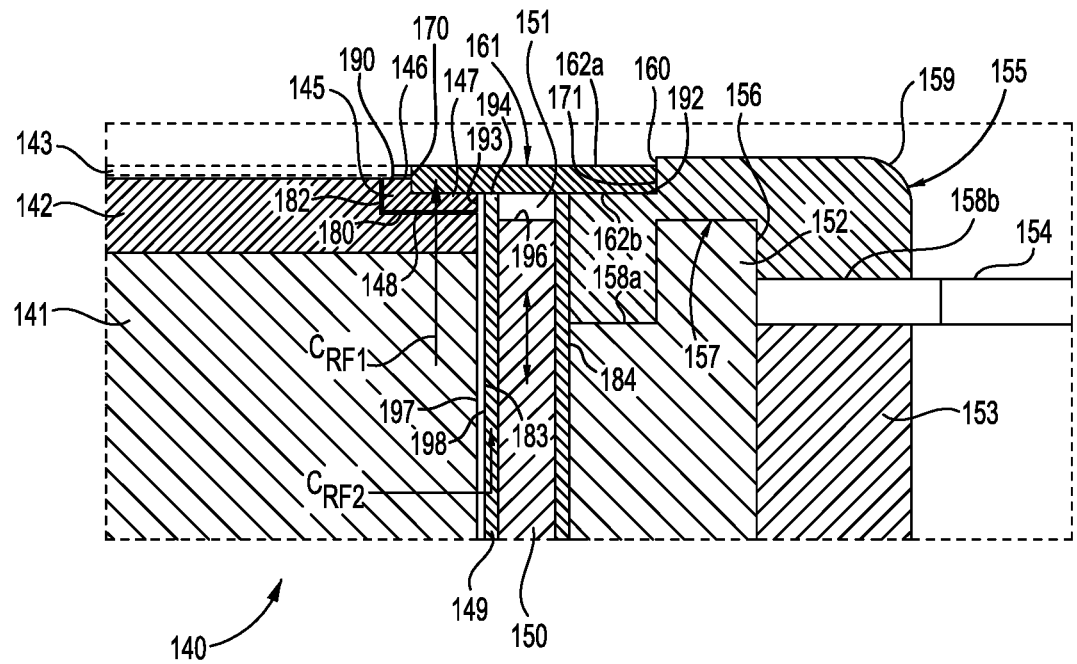

The processing chamber 107 includes a substrate support 140 therein for receiving a substrate 143 thereon (shown in FIG. 1B), and port 108 for ingress and egress of the substrate 143. The substrate support 140 includes, for example, an electrostatic chuck to facilitate chucking of substrates onto an upper surface of the substrate support 140. FIG. 1B is a partial enlarged view of FIG. 1A.

As shown in FIG. 1B, the substrate support 140 includes an electrostatic chuck base 141 having a puck 142 disposed thereon. The puck is formed form alumina or aluminum oxide. A substrate 143 (shown in phantom), such as a 200 mm, 300 mm, or 450 mm semiconductor wafer, can be positioned on the puck 142, and secured thereto via electrostatic chucking, to facilitate processing of the substrate 143 in the processing chamber 107.

A support ring 145 is positioned around and in contact with the puck 142. The support ring 145 rests in a stepped surface formed at the radially-outward and upper edge of the puck 142. The support ring 145 includes a stepped upper surface having a radially inward portion 146 which is raised above a radially outward portion 147. A lower surface 148 of the support ring 145 is parallel to both the radially inward portion 146 and the radially outward portion 147. In one example, the lower surface 148 is in contact with a lower portion 180 of the stepped surface formed in the puck 142. In another example, the lower surface 148 is in contact with a lower portion 180 of the stepped surface formed in the puck 142, and additionally, a radially inward sidewall 190 of the support ring 145 is in contact with a vertical edge 182 of a stepped surface formed around the puck 142.

A sliding ring 149 is disposed circumferentially around the electrostatic chuck base 141, the puck 142, and the support ring 145. The sliding ring 149 is configured to house a plurality of lift pins 150 disposed in respective openings 151 formed in the sliding ring 149. Each of the sliding ring 149 and the lift pins 150 may vertically actuate independently from one another via actuators (not shown), such as stepper motors. A quartz pipe 152 is disposed radially outward of the sliding ring 149. A liner 153 is disposed radially outward of the quartz pipe 152. A plasma shield 154 is positioned on an upper surface of the liner 153, encircling an upper end of the quartz pipe 152. The plasma shield 154 restricts plasma flow within the processing chamber 107.

As illustrated in FIG. 1B, an outer diameter defined by an outer edge 193 of the support ring 145 is less than an inner diameter defined by an inner edge 183 of the sliding ring 149.

A quartz ring 155 is positioned on the plasma shield 154 and the quartz pipe 152. An annular recess 156 is formed in a lower surface of the quartz ring 155 and engages a stepped upper surface 157 of the quartz pipe 152. A radially inward portion 158a of the lower surface of the quartz ring 155 is positioned lower (e.g., extends further from an upper surface of the quartz ring 155) than a radially outward portion 158b of the lower surface of the quartz ring 155. A radially outward and upper corner 159 of the quartz ring 155 included is rounded, however, other configurations are also contemplated. A stepped surface 160 is formed on a radially inward upper corner of the quartz ring 155 opposite the upper corner 159. A lower portion 192 of the stepped surface 160 engages an edge ring 161.

The edge ring 161 includes a planar upper surface 162a and a planar lower surface 162b, generally parallel to one another. In addition to engaging the stepped surface 160, the planar lower surface 162b of the edge ring 161 also engages the upper surface of the radially outward portion 147 of the support ring 145. During processing, an upper end 194 of the sliding ring 149 or an upper end 196 of the lift pin 150 may also engage the planar lower surface 162b of the edge ring 161 to elevate the edge ring 161 from the quartz ring 155 and the support ring 145. Elevation of the edge ring 161 may be used to adjust a plasma sheath adjacent a radially outward edge of the substrate 143, for example, by compensating for erosion of the edge ring 161. In one example, the edge ring 161 may be elevated a distance of up to about 2 millimeters (mm). However, after a certain amount of time, the edge ring 161 may be eroded to a point in which it is desirable to replace the edge ring 161. Aspects of the present disclosure facilitate removal and replacement of the edge ring 161 through the port 108, so that disassembly of the processing chamber 107 is unnecessary for edge ring 161 replacement.

As illustrated in FIG. 1B, an inner diameter defined by an inner edge 170 of the edge ring 161 is less than the outer diameter defined by the outer edge 193 of the support ring 145. An outer diameter defined by an outer edge 171 of the edge ring 161 is also greater than the outer diameter defined by an outer edge 193 of the support ring 145. Moreover, the outer diameter defined by the outer edge 171 of the edge ring 161 is greater than an outer diameter defined by an outer edge 184 of the sliding ring 149.

Figure 1C:
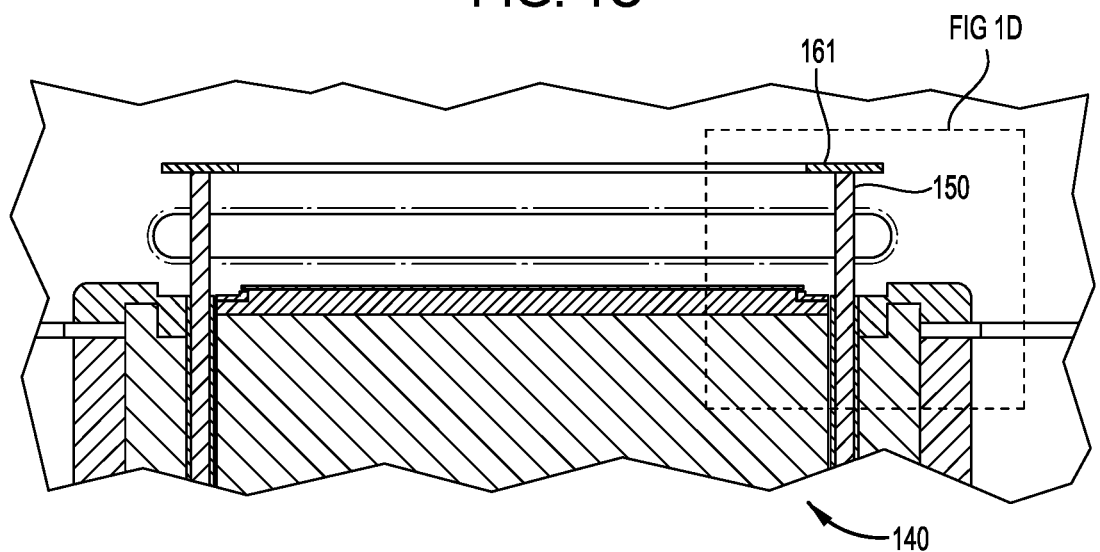
Figure 1D:
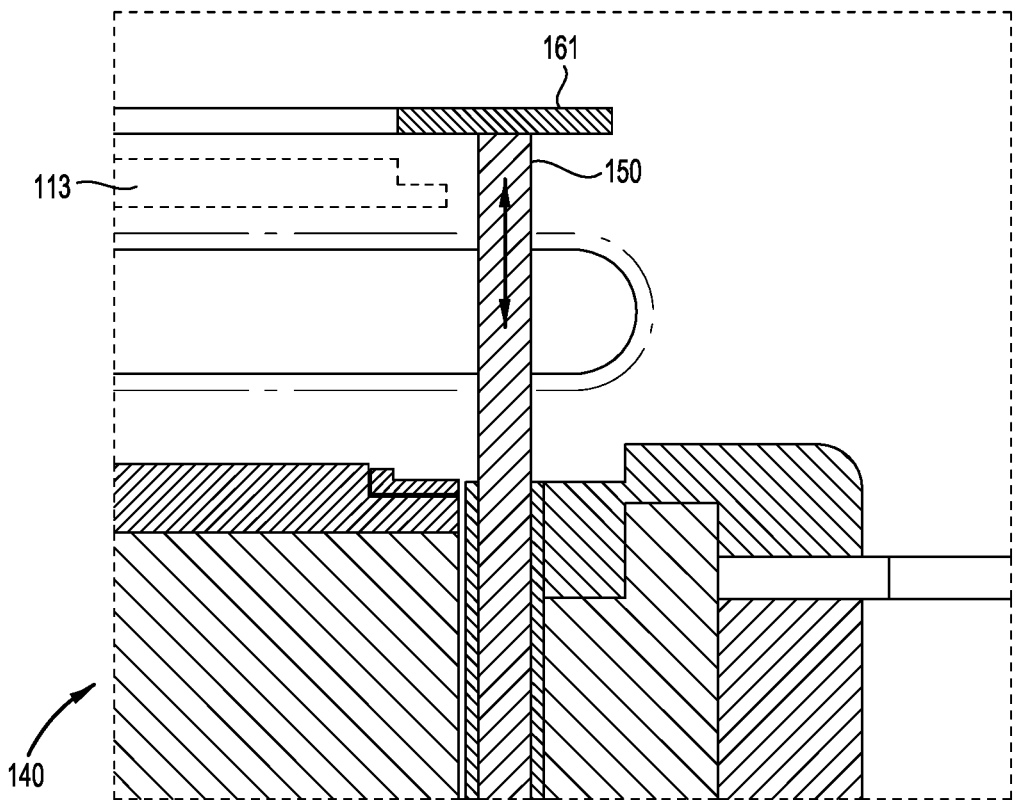

For removal of the edge ring 161, and with reference to FIGS. 1C and 1D, the edge ring 161 is elevated by the lift pins 150 to a height above the port 108 to provide clearance for receiving a carrier 113 (shown in phantom, FIG. 1D) beneath the edge ring 161. The carrier is positioned beneath the edge ring 161 by a robot blade, end effector, or the like (not shown for clarity in FIG. 1D).

Figure 1E:
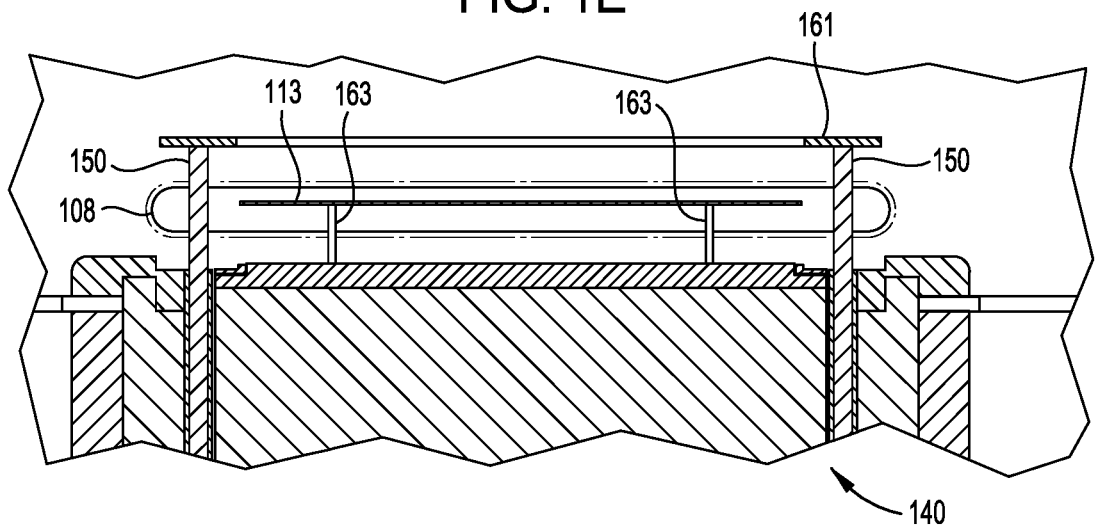

Referring now to FIG. 1E, once the carrier 113 is positioned beneath the edge ring 161 (e.g., over the substrate support 140 and concentrically aligned therewith), a plurality of lift pins 163 actuate vertically upward to lift the carrier 113 from the robot blade (not shown for clarity in FIG. 1E). Once the carrier 113 is lifted, the robot blade is removed from the process chamber 107. The lift pins 163 are located radially inward of the lift pins 150. In one example, three lift pins 163 are utilized to engage the carrier 113.

Figure 1F:
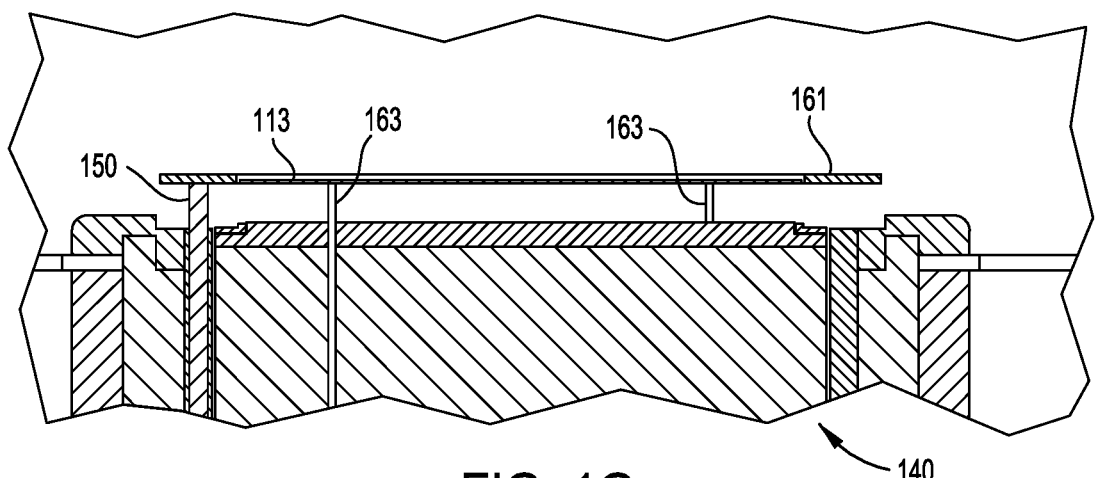
Figure 1G:
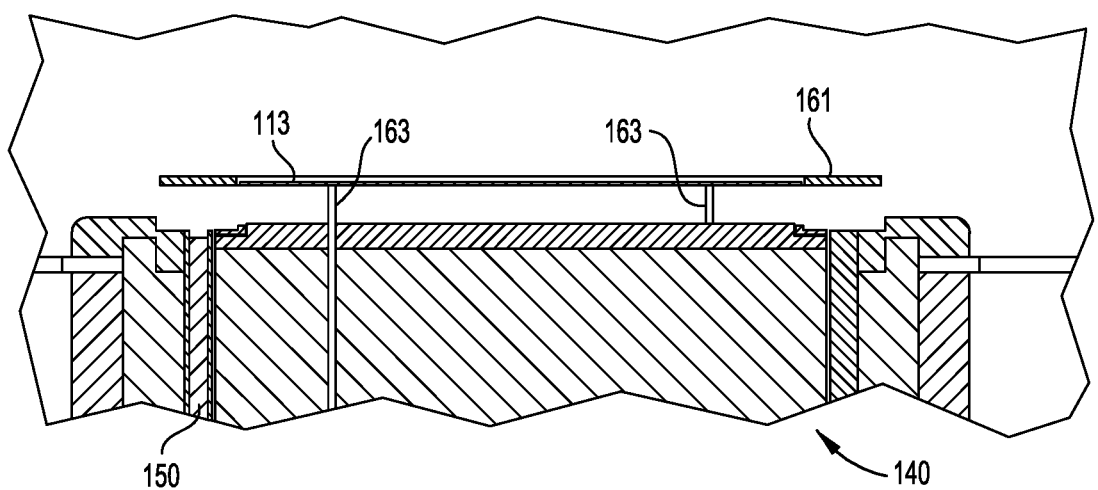
Figure 1H:
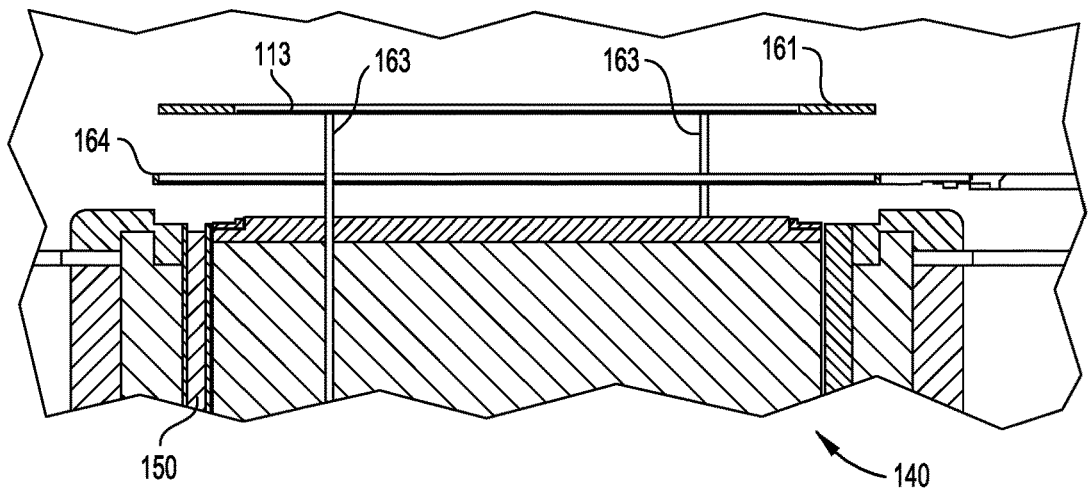

With the carrier 113 supported on the lift pins 163, the lift pins 150 descend to position the edge ring 161 on the carrier 113, as shown in FIG. 1F. The lift pins 150 continue to descend into the substrate support 140 while the edge ring 161 remains on the carrier 113, as shown in FIG. 1G. With the lift pins 150 recessed into the substrate support, the lift pins 163 are elevated upwards to raise the carrier 113 and the edge ring 161, as shown in FIG. 1H. The lift pins 163 are elevated to a height sufficient to allow ingress of a robot blade 164 into the processing chamber 107, as shown in FIG. 1H. The robot blade 164 is positioned beneath the carrier 113 and the edge ring 161, to facilitate placement of the carrier 113 onto the robot blade 164.

Figure 1I:
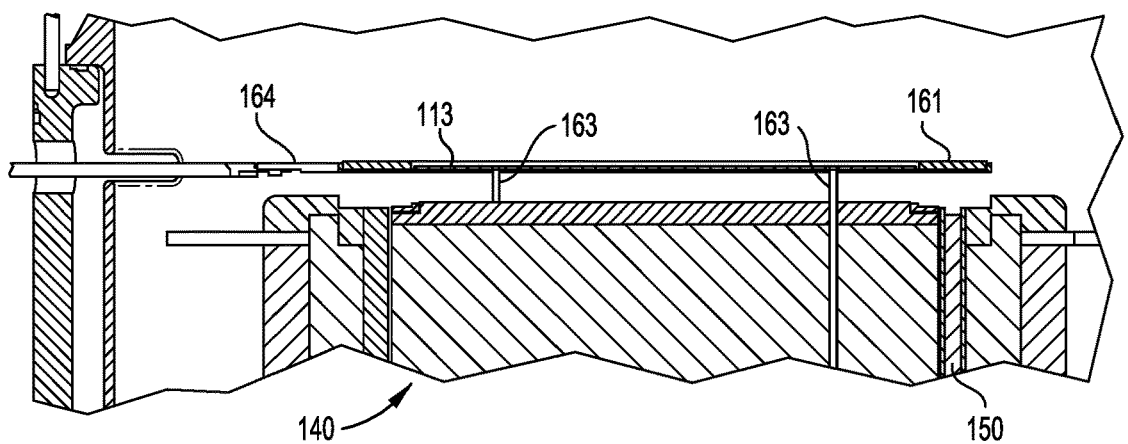
Figure 1J:
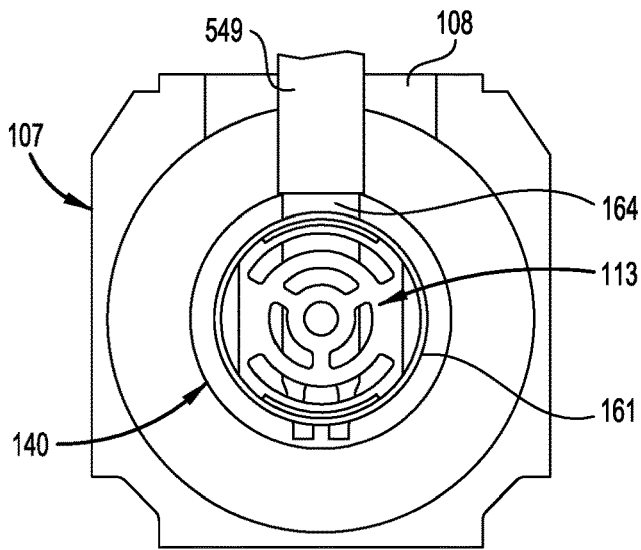

Once the robot blade 164 is positioned beneath the carrier 113, the lift pins 163 descend to position the carrier 113 onto the robot blade 164, as shown in FIG. 1I. Additional downward movement of the lift pins 163 eliminates interference between the robot blade 164 and the lift pins 163. With the lift pins 163 clear of the robot blade 164, the robot blade 164, as well as the carrier 113, the edge ring 161, and an optional robot wrist 549, are ready to be removed from the processing chamber 107 through a port 108, as shown in FIG. 1J. Subsequently, the carrier 113 is moved through the port 108 on the robot blade 164, and transferred according to the example of FIG. 6. It is contemplated that a new edge ring 161 may be introduced into the processing chamber 107 by reverse operation.

FIGS. 1A-1J illustrate one example of an edge ring removal process. However, other examples are also contemplated. For example, with reference to FIG. 1E, it is contemplated that the edge ring 161 may be lowered onto the carrier 113 while the carrier 113 is supported on the robot blade. The lift pins 150 may then descend to provide clearance, and the robot having the carrier 113 and the edge ring 161 thereon may be removed from the chamber through the port 108. In such an example, it is unnecessary for the carrier to first be transferred to lift pins 163.

Aspects herein are not limited to chamber hardware or processing components formed of specific materials. For example, it is contemplated that the edge ring 161, the support ring 145, and the sliding ring 149, and the liner 153 may be formed from one or more materials including quartz, silicon nitride, aluminum nitride, graphite, silicon carbide, or other ceramic materials. In one example, the edge ring 161 and the support ring 145 are formed of silicon carbide. Other materials are also contemplated.

Figure 1K:
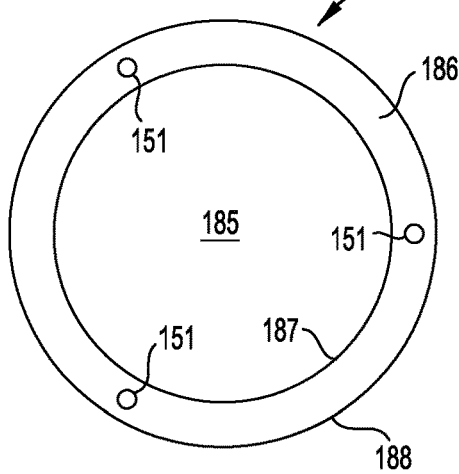
FIG. 1K is a top plan view of a sliding ring, shown in FIGS. 1A-1J, according to one aspect of the disclosure.

FIG. 1K is a top plan view of a sliding ring 149, shown in FIGS. 1A-1J, according to one aspect of the disclosure. The sliding ring 149 is a circular component having a central opening 185 defined by a body 186 with an inner diameter 187 and an outer diameter 188. One or more openings 151 (three are shown) are formed in or through the body 186 to accommodate lift pins 150 (shown in FIG. 1B) therein. The openings 151 are axially aligned with the central opening 185. In the example shown, the openings 151 have an axis that is parallel to an axis of the central opening 185.

With reference back to FIG. 1B, plasma sheaths are adjustable according to aspects herein. For example, during processing, the edge ring 161 may erode, which affects the planarity of the plasma sheath, particularly at radially outward edges of the substrate 143 (e.g., above adjacent the edge ring 161). To compensate for erosion, the edge ring 161 may be elevated by actuation of the sliding ring 149 to a selected height.

To further facilitate plasma sheath tunability, the edge ring 161 may be coupled to an RF source of the process chamber 107. In one example, the edge ring 161 is coupled to an RF source via a first path $C_{RF1}$ and a second path $C_{RF2}$. The first path $C_{RF1}$ is coupled from the electrostatic chuck base 141, through the puck 142 and the support ring 145, while the second path $C_{RF2}$ is coupled from the electrostatic chuck base 141 through the sliding ring 149. In such an example, the sliding ring 149 may be formed from a conductive material, such as a metal like aluminum, to facilitate constant or nearly constant RF coupling via second path $C_{RF2}$. The constant RF coupling through the second path $C_{RF2}$ results in a constant plasma sheath thickness across the surface of the substrate 143. In contrast, pin-based or non-conductive sleeve-based adjustment of the edge ring 161 results in RF decoupling as the edge ring 161 is elevated, which may cause plasma sheath collapse thereby resulting in plasma and processing non-uniformity.

In addition, aspects of the present disclosure further facilitate constant RF coupling by selecting RF powers such that capacitance of the second path $C_{RF2}$ is much greater than the capacitance of the plasma sheath. By maintaining the capacitance of the second path $C_{RF2}$ at a capacitance much greater than the capacitance of the plasma sheath, RF coupling is maintained which results in plasma sheath uniformity during processing. Moreover, when maintaining the capacitance of the second path $C_{RF}$ at a capacitance much greater than the capacitance of the plasma sheath, the voltage on the edge ring 161 stays constant. To facilitate a desired capacitance of along the second path $C_{RF2}$, a width of a gap between a radially outward edge 197 of the electrostatic chuck base 141 and a radially inward edge 198 of the sliding ring 149 may be selected to adjust the capacitance. Other gaps within or between relative components may also be adjusted to further tune capacitance and/or RF paths. Although gaps are shown between certain components in FIGS. 1A-1K, 2A, 2B, 3A-3C, 4A, 4B, 5A, 5B, and 6, it is contemplated that the gaps may be eliminated in some embodiments such that one or more of the components are in contact with each other. Additionally, although certain components are shown in contact with each other in FIGS. 1A-1K, 2A, 2B, 3A-3C, 4A, 4B, 5A, 5B, and 6, it is contemplated that such components can have gaps in between each other. For example, gaps may be included to prevent or reduce the probability of particle generation, allow for movement of the components, or reduce friction between the components during movement. To further facilitate desired capacitance and RF coupling, the edge ring 161 may have a resistivity of less than 50 ohm·cm, such as about 1 ohm·cm to about 40 ohm·cm. In such an example, the edge ring 161 may be formed from silicon or silicon carbide.

While not shown, it is contemplated that the processing chamber 107 may also include one or more gas diffusers, plasma generators, or other components (not shown) to facilitate substrate processing. To this end, the substrate support 140 is not limited to use with particular chamber components unless otherwise explicitly stated herein.

Figure 2A:
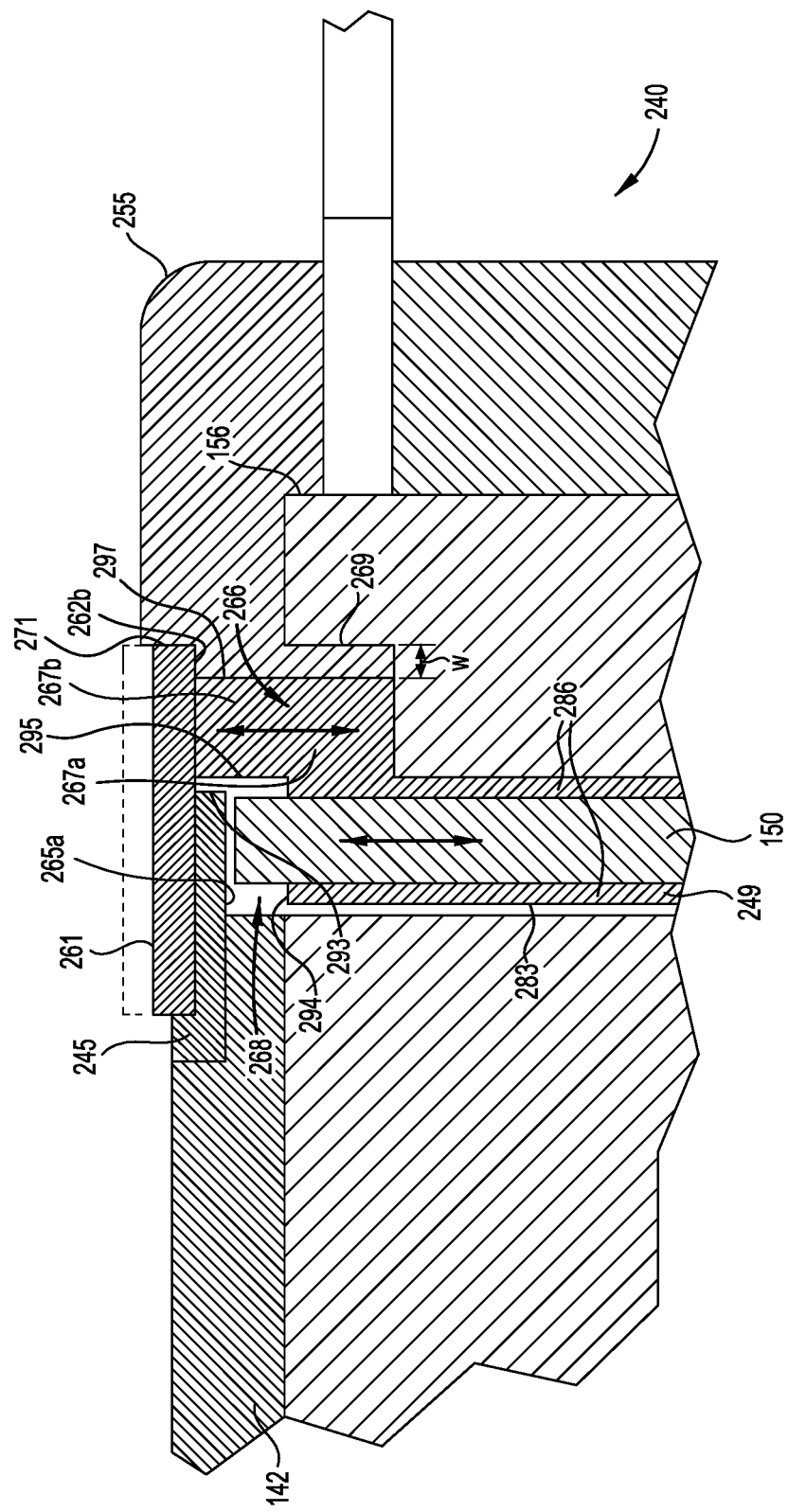

FIGS. 2A and 2B are schematic partial views of a substrate support 240 during a ring removal operation, according to another aspect of the disclosure. The substrate support 240 is similar to the substrate support 140 (shown in FIG. 1B), however, the substrate support 240 is configured to allow removal of the support ring 245 in addition to, and simultaneously with, the edge ring 261.

To facilitate removal of both the support ring 245 and the edge ring 261, the support ring 245 is extended radially outward to a position above the lift pins 150 (one is shown). Thus, the lift pins 150, when elevated, engage a lower surface 265a of the support ring 245. Continued vertical movement of the lift pin 150 raises the support ring 245, as well as the edge ring 261 positioned on the support ring 245. Once the support ring 245 and the edge ring 261 are elevated to a sufficient height above the puck 142, a carrier 113 is positioned to receive the support ring 245 and the edge ring 261, as shown in FIG. 2B. The support ring 245, and the edge ring 261 positioned thereon, are disposed on the carrier 113, and then the carrier 113 is removed from the processing chamber as similarly described with respect to FIGS. 1E-1J.

To facilitate adjustment of a plasma sheath during processing, without disturbing the support ring 245, a sliding ring 249 may be positioned to elevate the edge ring 261, as shown in FIG. 2A. The sliding ring 249 has a body 286. The sliding ring 249 is similar to the sliding ring 149, described above, but includes an extension 266. The extension 266 is positioned at an upward end of the sliding ring 249 and extends radially outward from the body 286 of the sliding ring 249. The extension 266 includes a horizontal portion 267a and a vertical portion 267b. The horizontal portion 267a extends radially outward from the body 286 of the sliding ring 249. The vertical portion 267b extends upward from the horizontal portion 267a. The vertical portion 267b is also axially aligned with the body 286 of the sliding ring 249, as illustrated in FIG. 2A. In the example shown, the vertical portion 267b has an axis that is parallel to an axis of the body 286 of the sliding ring 249. Actuation of the sliding ring 249 places the extension 266 into contact with a lower surface 262b of the edge ring 261 to facilitate raising of the edge ring 261. When the sliding ring 249 is in a lowermost position, a vertical gap 268 is present between a lower surface 265a of the support ring 145 and an upper end 294 of the sliding ring 249. The vertical gap 268 can allow some vertical movement of the sliding ring 249 without the sliding ring 249 contacting the support ring 245. In one example, the vertical gap 268 is greater than about 2 mm. As illustrated in FIG. 2A, an outer diameter defined by an outer edge 293 of the support ring 245 may be greater than an inner diameter defined by an inner edge 283 of the sliding ring 249. An inner diameter defined by an inner edge 295 of the vertical portion 267b may be greater than an outer diameter defined by an outer edge 293 of the support ring 245. Also, an outer diameter defined by an outer edge 297 of the vertical portion 267b may be less than an outer diameter defined by the outer edge 271 of the edge ring 261. To accommodate the extension 266 of the sliding ring 249, it is contemplated that a quartz ring 255 is utilized. The quartz ring 255 is similar to the quartz ring 155 (shown in FIG. 1B), however, the quartz ring 255 includes an increased internal diameter. Thus, a portion 269 located radially inward of the annular recess 156 includes a reduced width W compared to a corresponding portion of the quartz ring 155.

FIGS. 3A-3C are schematic partial views of a substrate support 340 during a ring removal operation, according to another aspect of the disclosure. The substrate support 340 is similar to the substrate support 240, but allows for independent removal and/or installation of the edge ring 361 and the support ring 345. A sliding ring 349 includes one or more openings 351 formed in the sliding ring 349. To facilitate independent removal and/or installation of the edge ring 361 and the support ring 345, the support ring 345 includes a plurality of openings 370 formed therein. Each opening 370 may be aligned with a respective lift pin 350 to allow passage of a lift pin 350 therethrough. The lift pin 350 is similar to the lift pin 150 described above, however, the lift pin 350 includes a lower portion 371a having a first diameter, and an upper portion 371b having a second diameter less than the first diameter. The first diameter is less than a diameter of the opening 370, while the second diameter is greater than the diameter of the opening 370. Thus, the upper portion 371b is capable of being accommodated within the openings 370, while the lower portion 371a is not. The first diameter transitions to the second diameter at shoulder 372. As illustrated in FIG. 3A, each of the openings 370 formed in the support ring 345 may be aligned with one of the openings 351 formed in the sliding ring 349.

With reference to FIGS. 3B and 3C, the edge ring 361 is capable of being removed independently of the support ring 345. Independent removal is beneficial when an edge ring 361 is utilized which erodes more quickly than a support ring 345. Thus, a support ring 345, which still has useful life remaining, need not be removed and/or replaced when removing an eroded edge ring 361. Thus, time and materials are saved.

FIG. 3B schematically illustrates removal of the edge ring 361. To remove the edge ring 361, the lift pin 350 is actuated upward, through the opening 370 in the support ring 345, to elevate the edge ring 361 from the substrate support 340. In the example shown, actuation of the edge ring 361 does not cause the support ring 345 to move. The lift pin 350 is elevated to a first height which provides clearance for a robot blade (not shown in FIG. 3B) and a carrier 313 beneath the edge ring 361. The carrier 313 is similar to the carrier 113 but includes a multi-step surface 375 around a perimeter thereof. The multi-step surface 375 includes a first stepped surface 376a for supporting the edge ring 361 thereon, and a second stepped surface 376b for supporting the support ring 345 thereon. The radial inward sidewall 376c of the first stepped surface 376a may have an outside diameter about equal to the inside diameter of the edge ring 361, such as about 95 percent to about 100 percent of the inside diameter of the edge ring 361. For example, the outside diameter of the radial inward sidewall 376c of the first stepped surface 376a may be about 98 percent to 100 percent, or about 99 percent to 100 percent, of the inside diameter of the edge ring 361. Similarly, the second stepped surface 376b has an outside diameter about equal to the inside diameter of the support ring 345; such as about 95 percent to 100 percent, or about 98 percent to 100 percent, or about 99 percent to 100 percent of the inside diameter of the support ring 345.

With the carrier 313 positioned beneath the edge ring 361, the edge ring 361 is transferred to the carrier 313 and removed from a process chamber 107, as similarly described above with respect to FIGS. 1E-1J. With carrier 313 and edge ring 361 removed from the process chamber 107, the lift pin 350 is actuated further upward. The shoulder 372 of the lift pin 350 engages a lower surface 348 of the support ring 345. Continued elevation of the lift pin 350 raises the support ring 345 from the substrate support 340 to a height sufficient to accommodate the carrier 313 between the support ring 345 and the substrate support 340, as shown in FIG. 3C. It is contemplated that lengths of the upper portion 371b and the lower portion 371a may be selected to provide desired positioning the edge ring 361 and the support ring 345 within the process chamber, while still allowing sufficient range of motion. Once the support ring 345 is raised, the carrier 313 is positioned above the substrate support 340 to receive the support ring 345 on a stepped surface 376b thereof. The carrier 313 and support ring 345 are removed from the process chamber 107, as similarly described above with respect to FIGS. 1E-1J.

Figure 4A:
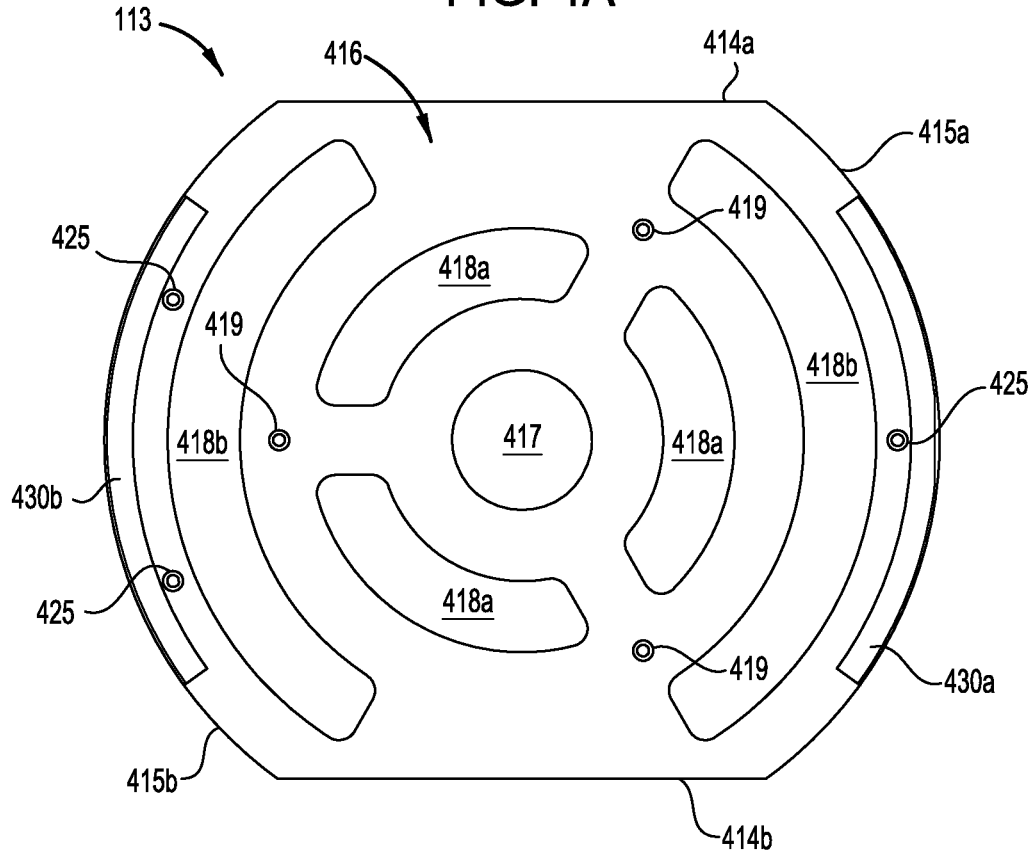
FIG. 4A is a schematic top plan view of a carrier, according to one aspect of the disclosure.
Figure 4B:
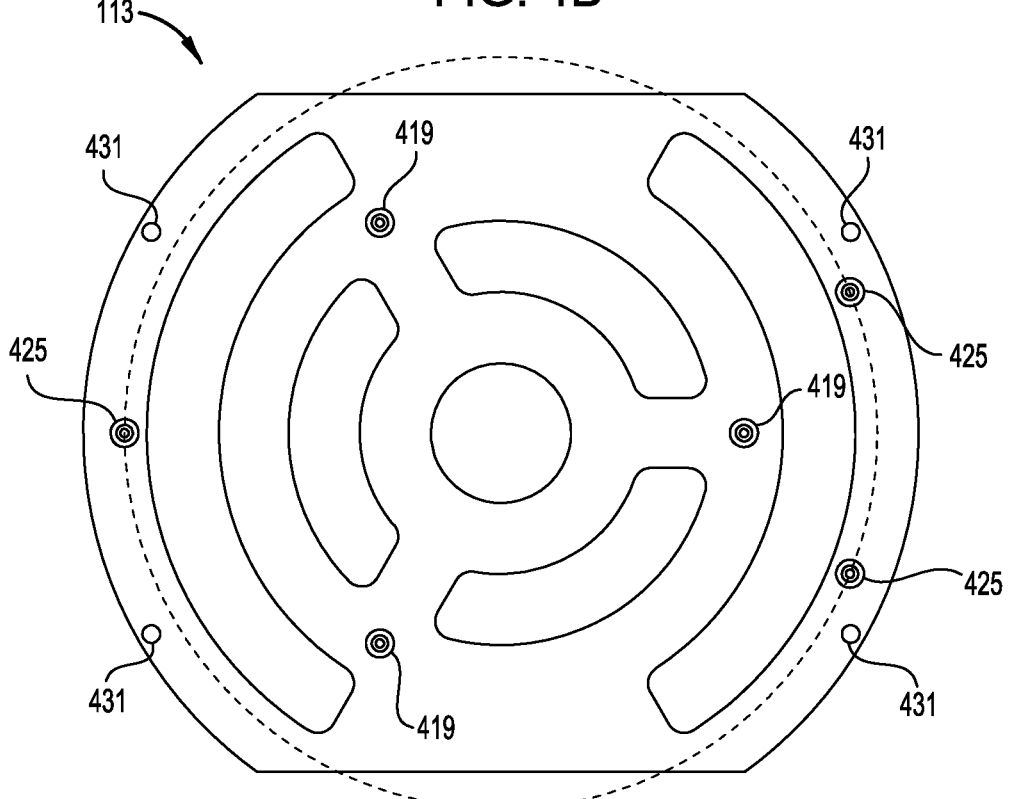
FIG. 4B is a schematic bottom plan view of the carrier of FIG. 4A.

FIG. 4A is a schematic top plan view of a carrier 113, according to one aspect of the disclosure. FIG. 4B is a schematic bottom plan view of the carrier 113 of FIG. 4A. The carrier 113 is a semi-circular plate 416 having a perimeter defined by two parallel edges 414a, 414b and two opposing curved edges 415a, 415b coupling the two parallel edges 414a, 414b. The curved edges 415a, 415b facilitate lateral support of an edge ring positioned thereon, while the two parallel edges 414a, 414b allow the carrier 113 to be accommodated in processing chambers not originally designed to accommodate a carrier 113 therein. For example, the two parallel edges 414a, 414b may facilitate actuation of lift pins (such as lift pins 150) within a processing chamber without interfering with the carrier 113 while the carrier 113 is located within the processing chamber. The carrier 113 also includes a first arcuate support structure 430a and a second arcuate support structure 430b.

The semi-circular plate 416 includes a central opening 417 and one or more semi-circular openings (three are shown) 418a positioned concentrically around the central opening 417. Additional semi-circular openings 418b are positioned concentrically about the one or more semi-circular openings 418a. The semi-circular openings 418a, 418b facilitate a reduction in weight of the carrier 113, allowing the carrier 113 to be used on existing transfer equipment not originally designed to handle weights in excess of semiconductor wafer weights. In one example, the semi-circular plate 416 is formed from one or more materials including carbon fiber, graphite, silicon carbide, graphite-coated-silicon-carbide, silicon nitride, silicon oxide, alumina, and the like. Other materials are also contemplated.

The semi-circular plate 416 also includes a first plurality of receptacles 419 disposed therein. The first plurality of receptacles 419 are sized and configured to receive a lift pin therein (such as lift pin 163) to facilitate actuation of the carrier 113 within a processing chamber. The first plurality of receptacles 419 are each located at the same radial distance from a center of the semi-circular plate 416. In one example, the first plurality of receptacles 419 are positioned at a radius greater than a radius of the semi-circular openings 418a, but at a radius less than a radius of the semi-circular openings 418b.

The semi-circular plate 416 also includes a second plurality of receptacles 425 (three are shown) disposed therein. The receptacles 425 are each configured to engage a supporting structure, such as a robot blade. Engagement of the receptacles 425 by the supporting structure reduces or prevents relative movement between the carrier 113 and the supporting structure during transfer of the carrier 113. For example, the supporting structure may include corresponding male plugs to be received within the receptacles 425.

Each of the receptacles 419, 425 may be formed from one or more of a metal, silicon carbide, graphite, alumina, silicon nitride, silicon oxide, polyethylene terephthalate, or a ceramic material. Other materials are also contemplated. In one example the receptacles 419, 425 are formed from a soft polymer material, such as Vespel®, Ultem®, acetal, PTFE, or a ceramic material such as silicon carbide, to reduce particle generation.

Figure 5A:
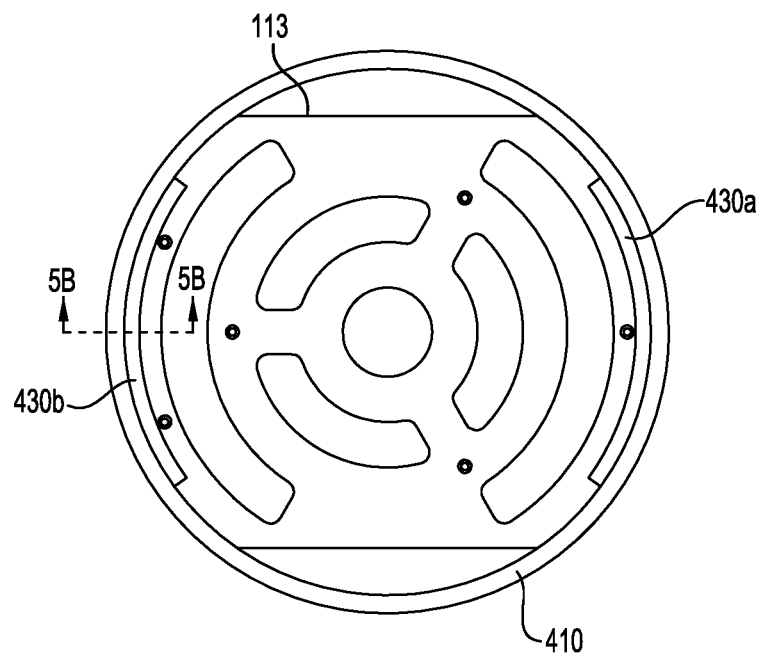
FIG. 5A is a schematic top plan view of a carrier supporting a ring thereon.
Figure 5B:
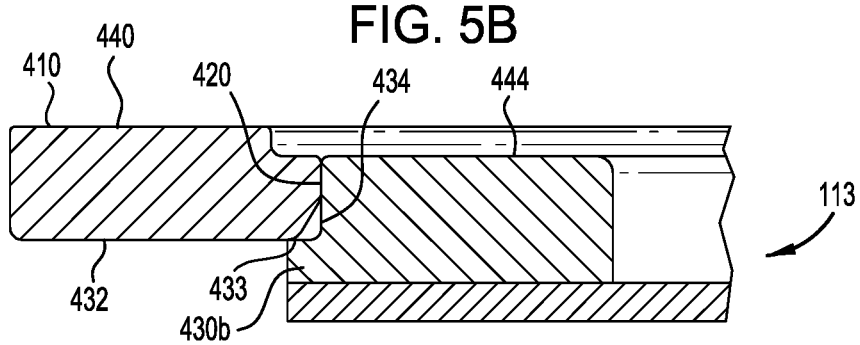
FIG. 5B is a schematic sectional view of FIG. 5A.

FIG. 5A is a schematic top plan view of a carrier 113 supporting an edge ring 410 thereon. FIG. 5B is a schematic sectional view of FIG. 5A. As shown in FIG. 5A and FIG. 5B, edge ring 410 is disposed on and supported by the first arcuate support structure 430a and the second arcuate support structure 430b. A lower surface 432 of the edge ring 410 contacts the supporting surfaces 433, while a radially inward edge 420 of the edge ring 410 contacts the vertical walls 434 of the first arcuate support structure 430a and the second arcuate support structure 430b. In the illustrated example, the edge ring 410 has an inner diameter less than an outer diameter of the first arcuate support structure 430a and the second arcuate support structure 430b, and the edge ring 410 has an outer diameter greater than the outer diameters of the first arcuate support structure 430a and the second arcuate support structure 430b. Additionally, an upper surface 440 of the edge ring 410 is disposed above upper surfaces 444 of the first arcuate support structure 430a and the second arcuate support structure 430b. In one example, one or both of the first arcuate support structure 430a and the second arcuate support structure 430b may include a feature, such as a flat surface, for engaging an electrostatic chuck or other substrate support to facilitate alignment therewith.

In the example shown in FIG. 4B, each of the first arcuate support structure 430a and the second arcuate support structure 430b (both shown in FIG. 4A) include male extensions 431 which engage openings (not shown in FIG. 4B) formed through the semi-circular plate 416. In one example, the openings and the male extensions 431, as well as the first arcuate support structure 430a and the second arcuate support structure 430b, are positioned radially outward of the receptacles 425. Each of the first arcuate support structure 430a and the second arcuate support structure 430b may have a radius of curvature that is about equal to a radius of curvature of the curved edges 415a, 415b.

Figure 6:
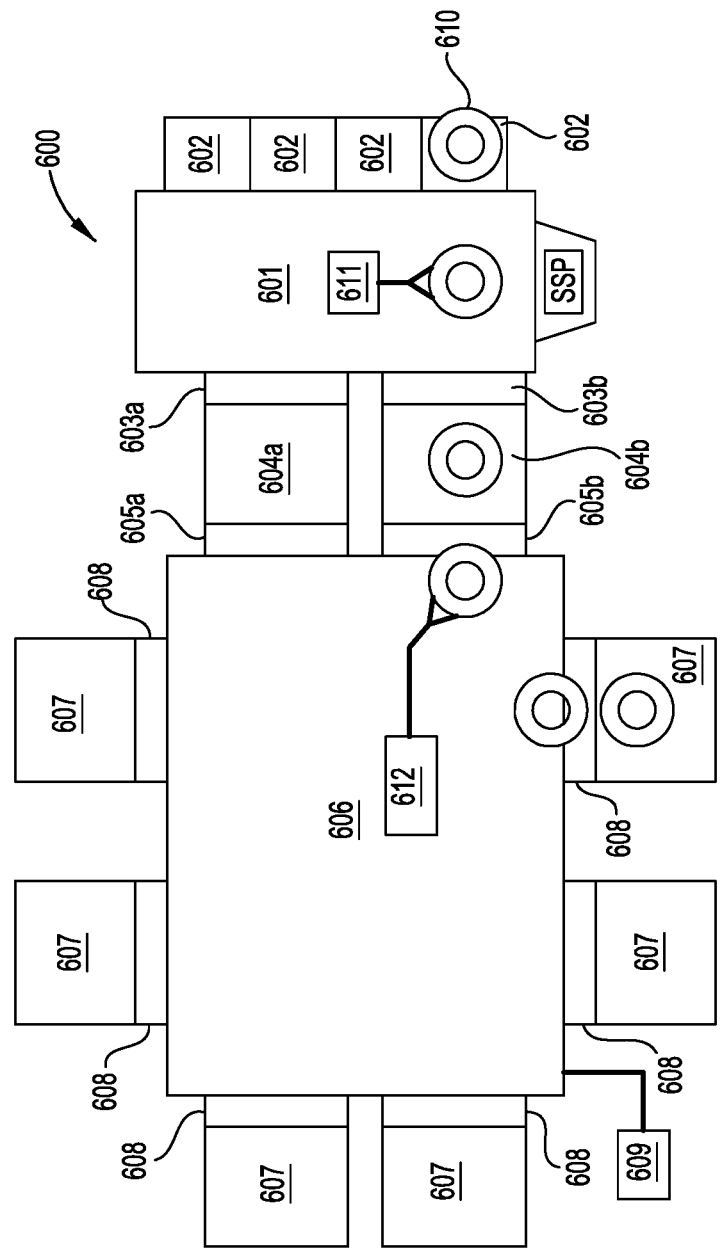
FIG. 6 illustrates a processing system, according to one aspect of the disclosure.

FIG. 6 illustrates a processing system 600, according to one aspect of the disclosure. The processing system 600 includes a factory interface 601 to which a plurality of cassettes 602 may be coupled for transferring substrates into the processing system 600. The processing system 600 also includes first vacuum ports 603a, 603b coupling the factory interface 601 to respective degassing chambers 604a, 604b. Second vacuum ports 605a, 605b are coupled to respective degassing chambers 604a, 604b and disposed between the degassing chambers 604a, 604b and a transfer chamber 606 to facilitate transfer of substrates into the transfer chamber 606. The transfer chamber 606 includes a plurality of processing chambers 607 disposed therearound and coupled thereto. The processing chambers 607 are coupled to the transfer chamber 606 through respective ports 608, such as slit valves or the like. A controller 609 controls various aspects of the processing system 600.

FIG. 6 schematically illustrates transfer of an edge ring 610 into a processing chamber 607. According to one aspect of the disclosure, an edge ring 610 is removed from one of the plurality of cassettes 602 via factory interface robot 611 located in the factory interface 601, or alternatively, is loaded directly into the factory interface 601. The factory interface robot 611 transfers the edge ring 611 through one of the first vacuum ports 603a, 603b and into a respective degassing chamber 604a, 604b. A transfer chamber robot 612 located in the transfer chamber 606 removes the edge ring 610 from one of the degassing chambers 604a, 604b through a second vacuum port 605a or 605b. The transfer chamber robot 612 moves the edge ring 610 into the transfer chamber 606, where the edge ring 610 may be transferred to a desired processing chamber 607 through a respective port 608. While not shown for clarity in FIG. 6, transfer of the edge ring 610 occurs while edge ring 610 is positioned on a carrier 113. Removal of the edge ring 610 from a processing chamber 607 occurs in reverse order.

FIG. 6 illustrates one example of edge ring transfer, however, other examples are also contemplated. For example, it is contemplated that an edge ring 610 may be manually loaded into the transfer chamber 606. From the transfer chamber 606, the edge ring 610 may be loaded into a processing chamber 607 by the transfer chamber robot 612. Additionally or alternatively, edge rings may be loaded in a support unit An additional support unit may be positioned in communication with the factory interface 601 opposite the illustrated support unit. When utilizing two support units or multiple cassettes 602, it is contemplated that one SSP or cassette 602 may be used for unprocessed edge rings 610, while another support unit or cassette 602 may be used for receiving processed rings 610. Benefits described herein include removal of chamber hardware without disassembly of a chamber. Thus, preventative maintenance can be performed with reduced downtime.

While FIG. 6 illustrates the transfer of an edge ring 610 through a processing system 600, it is contemplated that other consumable parts, such as process rings, support rings, and the like, may be transferred in a similar manner.

In one example of the present disclosure, a method comprises: actuating a plurality of lift pins vertically upward, each lift pin including a first diameter at an upper portion thereof and a second diameter greater than the first diameter at a lower portion thereof, the actuating including directing the upper portions of the lift pins through corresponding openings in a support ring; vertically actuating an edge ring positioned over the support ring; transferring the edge ring to a carrier; and removing the edge ring from a process chamber. In another example, the method may further comprise: actuating the lift pin further upward to engage the support ring with the lower portions of the lift pins having the second diameter, after the edge ring is removed from the process chamber.

In another example, the method may further comprise: lifting the support ring with the lower portions of the lift pins, and disposing the support ring on an empty carrier. In yet another example of the method, vertically actuating the edge ring may not cause the support ring to move.

While the foregoing is directed to embodiments of the present disclosure, other and further embodiments of the disclosure may be devised without departing from the basic scope thereof, and the scope thereof is determined by the claims that follow.

What is claimed is:

1. A process kit for a substrate support, the process kit comprising:
   a sliding ring having a body defined by an inner diameter and an outer diameter, the body having:
      one or more openings formed through the body, wherein each of the one or more openings has an axis that is parallel to an axis of the body;
      a horizontal portion at an upper end of the body, the horizontal portion extending radially outward from the inner diameter of the body; and
      a vertical portion extending from the horizontal portion in a first direction, wherein the first direction is parallel to the axis of the body;
   a support ring having a stepped upper surface with a radially inward portion raised above a radially outward portion, the support ring having an outer diameter; and
   an edge ring having a planar upper surface and a planar lower surface, the edge ring having:
      an inner diameter less than the outer diameter of the support ring; and
      an outer diameter greater than the outer diameter of the support ring; wherein:
      an inner diameter of the vertical portion of the sliding ring is greater than the outer diameter of the support ring, and
      the vertical portion of the sliding ring is configured to directly contact and support the edge ring, and wherein the outer diameter of the edge ring is greater than the outer diameter of the body of the sliding ring.

2. The process kit of claim 1, wherein the one or more openings formed in the body of the sliding ring comprise at least three openings.

3. The process kit of claim 1, wherein an outer diameter of the vertical portion of the sliding ring is less than the outer diameter of the edge ring.

4. The process kit of claim 1, wherein the outer diameter of the support ring is greater than the inner diameter of the body of the sliding ring.

5. The process kit of claim 1, wherein each of the one or more openings formed in the body of the sliding ring are configured to house one or more lift pins.

6. The process kit of claim 1, wherein the outer diameter of the support ring is greater than the inner diameter of the body of the sliding ring, the support ring includes one or more openings formed through the support ring, and each of the one or more openings formed through the support ring is aligned with one of the one or more openings formed through the body of the sliding ring.

7. A substrate support, comprising:
   an electrostatic chuck base;
   a puck positioned over the electrostatic chuck base; and
   a process kit, comprising:
      a sliding ring positioned around the electrostatic chuck base and having a body defined by an inner diameter and an outer diameter, the body having:
         one or more openings formed through the body, wherein each of the one or more openings has an axis that is parallel to an axis of the body;
         a horizontal portion at an upper end of the body, the horizontal portion extending radially outward from the inner diameter of the body; and
         a vertical portion extending from the horizontal portion in a first direction, wherein the first direction is parallel to the axis of the body;
      a support ring having a stepped upper surface with a radially inward portion raised above a radially outward portion, the support ring having an outer diameter; and
      an edge ring having a planar upper surface and a planar lower surface, the edge ring having:
         an inner diameter less than the outer diameter of the support ring; and
         an outer diameter greater than the outer diameter of the support ring;
      wherein:
         an inner diameter of the vertical portion of the sliding ring is greater than the outer diameter of the support ring, and
         the vertical portion of the sliding ring is configured to directly contact the edge ring when the edge ring is in a lowered position, and wherein the outer diameter of the edge ring is greater than the outer diameter of the body of the sliding ring.

8. The substrate support of claim 7, wherein the one or more openings formed in the body of the sliding ring comprise at least three openings.

9. The substrate support of claim 7, wherein an outer diameter of the vertical portion of the sliding ring is less than the outer diameter of the edge ring.

10. The substrate support of claim 7, wherein the outer diameter of the support ring is greater than the inner diameter of the body of the sliding ring.

11. The substrate support of claim 7, wherein each of the one or more openings formed in the body of the sliding ring are configured to house one or more lift pins.

12. The substrate support of claim 7, wherein the outer diameter of the support ring is greater than the inner diameter of the body of the sliding ring; and the support ring includes one or more openings formed therethrough, and each of the one or more openings is aligned with one of the one or more openings formed through the body of the sliding ring.

13. A process kit for a substrate support, the process kit comprising:
   a lift pin;
   a sliding ring having a body defined by an inner diameter and an outer diameter, the body having:
      one or more openings formed through the body, wherein each of the one or more openings has an axis that is parallel to an axis of the body, at least one of the one or more openings at least partially surrounding the lift pin;
      a horizontal portion at an upper end of the body, the horizontal portion extending radially outward from the inner diameter of the body; and
      a vertical portion extending from the horizontal portion extending in a first direction, wherein the first direction is parallel to the axis of the body;
   a support ring having a stepped upper surface with a radially inward portion raised above a radially outward portion, the support ring having an outer diameter; and
   an edge ring having a planar upper surface and a planar lower surface, the edge ring having:
      an inner diameter less than the outer diameter of the support ring; and
      an outer diameter greater than the outer diameter of the support ring; wherein:
         an inner diameter of the vertical portion of the sliding ring is greater than the outer diameter of the support ring,
         the vertical portion of the sliding ring is configured to directly contact the edge ring when the lift pin is in a lowered position, and
         the support ring is configured to directly contact and support the edge ring when the lift pin is in an elevated position, and wherein the outer diameter of the edge ring is greater than the outer diameter of the body of the sliding ring.

14. The process kit of claim 13, wherein the one or more openings formed in the body of the sliding ring comprise at least three openings, the lift pin disposed within one of the at least three openings.

15. The process kit of claim 14, further comprising two additional lift pins, each additional lift pin disposed within one of the at least three openings.

16. The process kit of claim 13, wherein an outer diameter of the vertical portion of the sliding ring is less than the outer diameter of the edge ring.

17. The process kit of claim 13, wherein the outer diameter of the support ring is greater than the inner diameter of the body of the sliding ring.

* * * * *